US009573334B2

(12) United States Patent
Nakai et al.

(10) Patent No.: US 9,573,334 B2
(45) Date of Patent: *Feb. 21, 2017

(54) HOT ISOSTATIC PRESSING DEVICE

(71) Applicant: Kobe Steel, Ltd., Kobe-shi (JP)

(72) Inventors: Tomomitsu Nakai, Takasago (JP); Katsumi Watanabe, Takasago (JP); Makoto Yoneda, Takasago (JP)

(73) Assignee: Kobe Steel, Ltd., Kobe-shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/782,949

(22) PCT Filed: May 2, 2014

(86) PCT No.: PCT/JP2014/062177
§ 371 (c)(1),
(2) Date: Oct. 7, 2015

(87) PCT Pub. No.: WO2014/192506
PCT Pub. Date: Dec. 4, 2014

(65) Prior Publication Data
US 2016/0039163 A1    Feb. 11, 2016

(30) Foreign Application Priority Data

May 28, 2013   (JP) ................................ 2013-111957

(51) Int. Cl.
*B30B 11/00*   (2006.01)
*B22F 3/15*    (2006.01)
(Continued)

(52) U.S. Cl.
CPC ............. *B30B 11/002* (2013.01); *B22F 3/15* (2013.01); *B28B 3/006* (2013.01); *F27B 5/04* (2013.01);
(Continued)

(58) Field of Classification Search
CPC ..................................................... B30B 11/002
(Continued)

(56) References Cited

U.S. PATENT DOCUMENTS

| 4,532,984 A | 8/1985 | Smith, Jr. |
| 6,250,907 B1 | 6/2001 | Bergman |

(Continued)

FOREIGN PATENT DOCUMENTS

| CN | 102781656 A | 11/2012 |
| CN | 103009659 A | 4/2013 |

(Continued)

OTHER PUBLICATIONS

International Search Report and Written Opinion issued on Jun. 10, 2014 for PCT/JP2014/062177 filed on May 2, 2014.

*Primary Examiner* — Joseph S. Del Sole
*Assistant Examiner* — Thukhanh T Nguyen
(74) *Attorney, Agent, or Firm* — Oblon, McClelland, Maier & Neustadt, L.L.P.

(57) ABSTRACT

Provided is a hot isostatic pressing (HIP) device (1) that can efficiently cool a hot zone during HIP processing while restraining temperatures in the lower part of a high-pressure container. This HIP device (1) is provided with the following: gas-impermeable casings (3, 4) that surround an object to be processed (W); a heating unit (7) that is disposed inside these casings and forms a hot zone around the object to be processed (W); a high-pressure container (2); and a cooling unit that guides a pressure-medium gas cooled on the outside of the casings into the hot zone to cool the hot zone. The cooling unit comprises the following: a gas introduction unit that introduces the pressure-medium gas that has been cooled on the outside of the casings (3, 4) into the hot zone; and a cooling promotion unit (37) that cools the pressure medium gas by causing the pressure-medium gas that has (Continued)

been cooled on the outside of the casings to exchange heat with a base (11) of the high-pressure container (2).

6 Claims, 2 Drawing Sheets

(51) Int. Cl.
| | |
|---|---|
| F27B 5/04 | (2006.01) |
| F27B 5/06 | (2006.01) |
| F27B 5/16 | (2006.01) |
| F27B 17/00 | (2006.01) |
| F27D 7/02 | (2006.01) |
| F27D 7/04 | (2006.01) |
| F27D 7/06 | (2006.01) |
| F27D 9/00 | (2006.01) |
| H01L 21/67 | (2006.01) |
| B28B 3/00 | (2006.01) |

(52) U.S. Cl.
CPC ................ *F27B 5/06* (2013.01); *F27B 5/16* (2013.01); *F27B 17/0025* (2013.01); *F27D 7/02* (2013.01); *F27D 7/04* (2013.01); *F27D 7/06* (2013.01); *F27D 9/00* (2013.01); *H01L 21/67109* (2013.01); *B22F 2003/153* (2013.01); *B22F 2203/11* (2013.01)

(58) Field of Classification Search
USPC ............ 425/73–74, 77–78, 210, 405.2, 815; 432/199, 205, 233, 249; 219/400
See application file for complete search history.

(56) References Cited

U.S. PATENT DOCUMENTS

| | | |
|---|---|---|
| 2009/0000495 A1 | 1/2009 | Graf |
| 2011/0165283 A1 | 7/2011 | Nakai et al. |
| 2013/0071508 A1* | 3/2013 | Nakai ................ B30B 11/002 425/405.2 |

FOREIGN PATENT DOCUMENTS

| | | |
|---|---|---|
| JP | 62-58770 B2 | 12/1987 |
| JP | 4-240389 A | 8/1992 |
| JP | 2000-501780 A | 2/2000 |
| JP | 2007-309626 A | 11/2007 |
| JP | 2008-290151 A | 12/2008 |
| JP | 2011-127886 A | 6/2011 |
| JP | 2013-178070 A | 9/2013 |

* cited by examiner

HOT ISOSTATIC PRESSING DEVICE

TECHNICAL FIELD

The present invention relates to a hot isostatic pressing device.

BACKGROUND ART

Conventionally, the HIP method, which is a pressing method using a hot isostatic pressing device, has been known. In this HIP method, the following processing is performed: a workpiece such as a sintered product (ceramics and the like), a casting, or the like is heated to a temperature higher than a recrystallization temperature of the workpiece in an atmosphere of a pressure-medium gas that is set at a high pressure of several tens to several hundreds of MPa. Therefore, the HIP method is characterized in that residual pores in the workpiece can be extinguished. The HIP method, therefore, has been recognized to have effects such as the improvement of mechanical properties, the reduction of variations of properties, and the improvement of the yield, and has become used widely in industries in these days.

Incidentally, in real production sites, speedup of processing has been desired earnestly, and it is considered that, for this purpose, it is necessary and indispensable to carry out the cooling step in a short time, which is a time-consuming step among the steps for HIP processing. To cope with this, for the conventional hot isostatic pressing device (hereinafter referred to as a "HIP device"), various methods for improving the cooling speed while holding the inside of a furnace in a thermally uniform condition have been proposed.

For example, Patent Document 1 discloses a HIP device that includes the following: a high-pressure container that houses a workpiece; a gas-impermeable inner casing that is provided so as to surround the workpiece in the inside of the high-pressure container; a gas-impermeable outer casing that is provided outside the inner casing so as to surround the same; and a heating means that is provided inside the inner casing so as to form a hot zone around the workpiece. The hot zone is formed inside the inner casing, and is held in a heat insulated manner by the inner casing and the outer casing. The isostatic pressing processing is performed by using a pressure-medium gas stored in the hot zone.

This HIP device further includes a cooling means that cools the workpiece in the hot zone by circulating the pressure-medium gas in the inside of the high-pressure container. This cooling means includes a first cooling means and a second cooling means.

The first cooling means performs the cooling by circulating the pressure-medium gas in such a manner that the pressure-medium gas forms a first circulating flow. In this first circulating flow, the pressure-medium gas is cooled while being led so as to flow between the inner casing and the outer casing from below to above, guided from an upper part of the outer casing toward the outside of the outer casing, and further guided from above to below along an inner circumference surface of the high-pressure container. The pressure-medium gas thus cooled is returned from below the outer casing to between the inner casing and the outer casing.

The second cooling means cools the pressure-medium gas by circulating the pressure-medium gas in such a manner that the pressure-medium gas forms a second circulating flow. In the second circulating flow, the pressure-medium gas in the hot zone is guided to the outside of the hot zone so as to join the pressure-medium gas that is forcibly circulated by the above-described first cooling means, whereby the pressure-medium gas is cooled. In this way, the circulation of the pressure-medium gas is performed so that a part of the pressure-medium gas thus cooled is returned to the hot zone.

In the above-described hot isostatic pressing device of Patent Document 1, a part of the pressure-medium gas composing the first circulating flow is caused to join the second circulating flow from a lower part of the hot zone with use of a fan and an ejector, and the pressure-medium gas thus joining cools the hot zone while circulating in the hot zone. This makes it possible to eliminate a temperature difference between the upper and lower parts of the furnace that occurs in the cooling process, thereby effectively cooling the inside of the furnace.

Further, Patent Document 2 discloses a hot isostatic pressing device that carries out a cooling step in a short time by taking out a pressure-medium gas in a high-pressure container to outside the container, cooling the same outside the container, and thereafter returning the same into the container.

In the case of the HIP device disclosed in the Patent Document 1, the high-temperature gas in the hot zone is guided toward above outside the heat-insulation layer, the high-temperature gas and an inner surface of the container are caused to exchange heat while this high-temperature gas goes down through the clearance between the container and the heat-insulation layer whereby the temperature of the high-temperature gas falls, and the gas having a lower temperature as a result is circulated in the hot zone, all of which makes it possible to quickly cooling the hot zone. In particular, it can be considered that in the HIP device disclosed in Patent Document 1, the pressure-medium gas forming the first circulating flow is sufficiently cooled to such a low temperature that the soundness of the pressure container and the like can be maintained.

This prior art, however, involves a problem that the temperature of electrical components and the like provided in a lower part of the high-pressure container cannot be dropped enough. To describe more specifically, in the lower part of the high-pressure container, there are a fan and a motor having a rotation control function for promoting the circulation of gas, a valve for gas flow control, and an actuator for the same, or contact points for an electric heater and a thermocouple for measuring temperature, and the like, and it cannot be considered that the temperature of the lower part of the high-pressure container is sufficiently low from the viewpoint of the heat-resisting properties of these members. Accordingly, there is a possibility that these electrical components are burnt out.

This problem tends to be more serious when, as is the case with the device disclosed in Patent Document 1, the low-temperature pressure-medium gas that forms the first circulating flow, and the high-temperature pressure-medium gas that forms the second circulating flow are caused to join first, and the pressure-medium gas after the joining is caused to go down along an inner circumference surface of the high-pressure container.

For example, in a quick cooling method that has been performed conventionally, only the pressure-medium gas that forms the first circulating flow, which goes down along the inner circumference surface of the high-pressure container without forming the second circulating flow, thereby coming to have a lower temperature, is guided into the hot zone, and the pressure-medium gas thus having a higher temperature is guided again to the inner circumference surface of the high-pressure container. In such a quick cooling method, the circulation flow rate itself is small. Therefore, the temperature of the circulation flow after going down along the inner circumference surface of the high-pressure container is low, and is already cooled to such a temperature that electrical components should not be burnt out. In the case where the pressure-medium gas that forms the first circulating flow and the pressure-medium gas that forms the second circulating flow are mixed first and the pressure-medium gas thus formed by mixing is caused to flow down along the inner circumference surface of the high-pressure container so as to be cooled, however, the flow rate of the circulation gas is large, and there is a possibility that the temperature of the pressure-medium gas does not fall sufficiently. This makes the possibility higher that the high-temperature pressure-medium gas flows to the lower part of the high-pressure container, and causes the electrical components to be burnt out.

Such a cooling method that pressure-medium gases are mixed first are cooled is used often in the case where the amount of circulation of the pressure-medium gas that forms the first circulating flow is increased so that the cooling speed is increased, as is the case with the HIP device of Patent Document 1. The HIP device of Patent Document 1, therefore, has a problem that there is a greater possibility that electrical components are burnt out depending on driving conditions.

CITATION LIST

Patent Document

Patent Document 1: JP2011-127886A
Patent Document 2: JP2007-309626A

SUMMARY OF THE INVENTION

An object of the present invention is to provide a hot isostatic pressing device that can efficiently cool a hot zone in a processing chamber, including a lower part of a high-pressure container, after HIP processing.

The hot isostatic pressing device provided by the present invention includes the following: a gas-impermeable casing that has gas impermeability and is arranged so as to surround a workpiece; a heating unit that is provided inside the casing so as to form a hot zone around the workpiece, thereby making it possible to perform hot isostatic pressing processing to the workpiece by using a pressure-medium gas in the hot zone; a high-pressure container that surrounds a space where the heating unit and the casing are housed and that includes a base that closes the space from below; and a cooling unit that cools the hot zone by guiding, into the hot zone, the pressure-medium gas having been cooled while flowing from above to below outside the casing. The cooling unit includes the following: a gas introduction unit that guides the pressure-medium gas cooled outside the casing, from a lower part of the high-pressure container to an upper part of the hot zone into the hot zone, in such a manner that the pressure-medium gas should not meet the pressure-medium gas inside the hot zone; and a cooling promotion unit that cools the pressure-medium gas having been cooled outside the casing by allowing the pressure-medium gas to exchange heat with the base.

DESCRIPTION OF EMBODIMENTS

Hereinafter, an embodiment of the present invention is described in detail with reference to the drawings.

Figure 1:
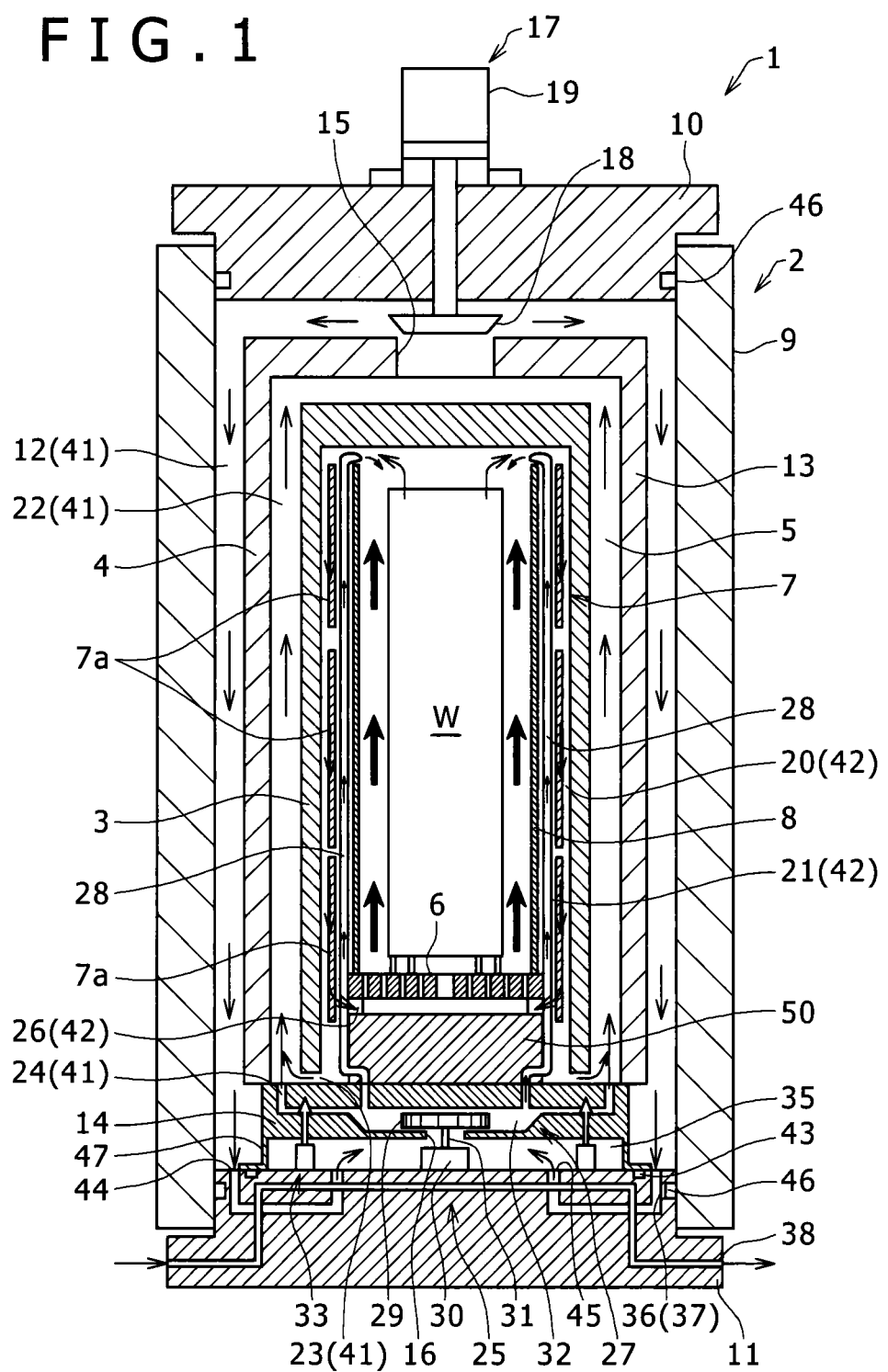
FIG. 1 is a sectional front view of a HIP device according to a First Embodiment.

FIG. 1 illustrates a hot isostatic pressing device 1 according to the First Embodiment of the present invention (hereinafter referred to as a "HIP device 1). This HIP device 1 includes a high-pressure container 2 that houses a workpiece W, and a casing having gas-impermeability. The casing includes an inner casing 3 and an outer casing 4. The inner casing 3 has gas impermeability, and is arranged in the inside of the high-pressure container 2 so as to surround the workpiece W. The outer casing 4 has gas impermeability, and is arranged outside the inner casing 3 so as to surround the same. Between the inner casing 3 and the outer casing 4, there is provided a heat-insulation layer 5, which is not illustrated in the drawings. This heat-insulation layer 5 thermally isolates the inside of the inner casing 3 from the outside of the inner casing 3.

The HIP device 1 further includes a workpiece support table 6 that supports the workpiece W inside the inner casing 3, a heating unit 7 that heats a pressure-medium gas, and a straightening cylinder 8. The workpiece W is mounted on the workpiece support table 6. The straightening cylinder 8 is interposed between the heating unit 7 and the workpiece W so as to separates these. The heating unit 7 is provided outside the straightening cylinder 8 and heats the pressure-medium gas. The high-temperature pressure-medium gas thus heated is supplied from below the straightening cylinder 8 to the inside of the straightening cylinder 8 so as to surround the workpiece W, thereby forming a hot zone. In this hot zone, hot isostatic pressing processing (hereinafter referred to as "HIP processing") with respect to the workpiece W is performed.

Hereinafter, members that compose the HIP device 1 are described in detail.

The high-pressure container 2 includes a container main body 9, a lid 10, and a base 11. The container main body 9 is formed in a cylindrical shape having an axis extended in the vertical direction. This container main body 9 is opened at upper and lower ends. The lid 10 closes the upper-side opening of the container main body 9 (the upper side as viewed on the sheet surface in FIG. 1), and the base 11 closes the lower-side opening of the container main body 9 (the lower side as viewed on the sheet surface in FIG. 1). Further, the lid 10 and the base 11 are supported by press frames, which are not illustrated in the drawing, so that they should not get out of the container main body 9 due to pressure of the pressure-medium gas in the container main body 9.

Sealing members 46 are provided between the above-described upper-side opening of the container main body 9 and the lid 10, and between the above-described lower-side opening of the container main body 9 and the base 11, respectively. These sealing members 46 airtightly separate the inside of the high-pressure container 2 from the outside.

To the high-pressure container 2, supply pipes and discharge pipes are connected, which are provided around the high-pressure container 2 and are not illustrated in the drawing. Through these supply pipes and discharge pipes, the pressure-medium gas having a high temperature and a high pressure, for example, argon gas, nitrogen gas, or the like that are pressurized to about 10 to 300 MPa so as to enable HIP processing, are supplied and discharged to and from the container, respectively.

The outer casing 4 is a cylindrical-shaped member with a lid, provided in the inside of the high-pressure container 2. This outer casing 4 is formed using a gas-impermeable heat-resistant material such as stainless steel, nickel alloy, molybdenum alloy, or graphite, according to temperature conditions of the HIP processing. The outer casing 4 is in a cylindrical shape having a diameter smaller than that of the above-described high-pressure container 2, and is arranged in the inside of the high-pressure container 2, with a distance in the radial direction from the inner circumference surface of the high-pressure container 2. In other words, a clearance is provided between the outer circumference surface of the outer casing 4 and the inner circumference surface of the high-pressure container 2. This clearance forms an outer passage 12 through which the pressure-medium gas can flow in the vertical direction.

More specifically, the outer casing 4 includes an outer casing body 13 opened to the lower side, which is in a shape like a glass that is turned over, and an outer casing base 14 that closes the lower-side opening of the outer casing body 13. In an upper part of the outer casing body 13, an upper opening part 15 is formed, and through this upper opening part 15, the pressure-medium gas in the outer casing 4 is led from below to above, and is guided to the outside of the outer casing 4. This upper opening part 15 is provided with a first valve means 17 that blocks flow of the pressure-medium gas flowing from the inside of the outer casing 4 to the outer passage 12, which is outside the outer casing 4.

In the center part of the outer casing base 14, a lower opening part 16 is formed. As is the case with the upper opening part 15, the lower opening part 16 allows the pressure-medium gas having flown to below the outer casing base 14 via the outer passage 12 to be guided to the hot zone via the lower opening part 16. A part of the pressure-medium gas introduced through the lower opening part 16 to the inside of the outer casing base 4 flows to an inner passage 22 through a second flow hole 24, which is to be described below, and the other part of the pressure-medium gas is guided to the hot zone via a plurality of conduits 28. The lower opening part 16 is provided with a forced circulation unit 25 for promoting circulation of the pressure-medium gas introduced thereto through this lower opening part 16, as is described below.

The second flow hole 24 is formed in the outer casing base 14, so as to allow a part of the pressure-medium gas that is present on the outside of the outer casing 4 (on the lower side of the outer casing base 14) to flow via the second flow hole 24 to the inside of the outer casing 4. This second flow hole 24 is formed so as to pass through the outer casing base 14 and connect the upper and lower sides of the outer casing base 14. The second flow hole 24 has an inlet port provided on the lower surface of the outer casing base 14, and an outlet port provided on an upper surface of the outer casing base 14, and allows the pressure-medium gas taken in through the inlet port to be fed back to the inner passage 22.

The first valve means 17 includes a plug member 18 that closes the upper opening part 15 of the outer casing 4, and a moving means 19 that moves the plug member 18 in the vertical direction. The moving means 19 is provided outside the high-pressure container 2, and the upper opening part 15 can be opened/closed by using this moving means 19 to move the plug member 18 in either of the upward direction and the downward direction. In other words, the passage and blockage of the pressure-medium gas flowing via the upper opening part 15 can be switched arbitrarily from one to the other.

The inner casing 3 is a case provided inside the outer casing 4, and is formed in an approximately cylindrical shape extended in the vertical direction, as is the case with the outer casing 4. The inner casing 3 is formed in a cylindrical shape having a diameter smaller than that of the outer casing 4, and is arranged in the inside of the outer casing 4, with a distance in the radial direction from the inner circumference surface of the outer casing 4. In other words, a clearance can be provided between the outer circumference surface of the casing 3 and the inner circumference surface of the outer casing 4. The heat-insulation layer 5 is provided in this clearance. The heat-insulation layer 5 is formed with a material having gas flowing properties, for example, a graphite material in which carbon fibers are braided, or a porous material such as ceramic fibers. In other words, the clearance forms the inner passage 22 that allows the pressure-medium gas to permeate through the heat-insulation layer 5 and flow in the upward and downward directions.

The inner casing 3 formed in a shape like a glass that is turned over, with a heat-resistant material similar to that of the outer casing 4, and is arranged slightly above the upper surface of the above-described outer casing base 14, so as to have a clearance above the upper surface of the outer casing base 14. In other words, a clearance extending in the vertical direction is formed between a lower part of the inner casing 3 and the outer casing base 14. This clearance forms a first flow hole 23 that allows the pressure-medium gas present in the inside of the inner casing 3 to flow toward the outside (to the inner passage 22).

The heating unit 7 and the straightening cylinder 8 are provided in the inside of the inner casing 3. The straightening cylinder 8 is positioned on an inner side in the radial direction with respect to the heating unit 7, and the inside of the straightening cylinder 8 is regarded as the hot zone. Next, the internal structure of the inner casing 3 is described.

The heating unit 7 includes a plurality of cylindrical heater elements 7a arrayed in the vertical direction. In the present embodiment, the heater elements 7a are provided at three positions arranged in the vertical direction. The heating unit 7, including these heater elements 7a, is arranged in the inner casing 3, with a distance in the radial direction from the inner circumference surface of the inner casing 3. Further on the inner side in the radial direction with respect to the heating unit 7, at a distance therefrom, there is provided the straightening cylinder 8.

On the inner side and the outer side in the radial direction of the heating unit 7, gas flow passages are formed that allow the pressure-medium gas to flow upward and downward, respectively. More specifically, an outer gas flow passage 20 on the outer side of the heating unit 7, and an inner gas flow passage 21 on the inner side of the heating unit 7, are formed. The outer gas flow passage 20 extends in the vertical direction along the inner circumference surface of the inner casing 3, and a lower end thereof communicates with the above-described first flow hole 23. Through this first flow hole 23, the pressure-medium gas in the inside of the hot zone is guided to the outer passage 12. The inner gas flow passage 21 on the inner side of the heating unit 7 extends in the vertical direction along the outer circumference surface of the straightening cylinder 8, and communicates with a gas introduction hole 26 formed below the straightening cylinder 8. Through this gas introduction hole 26, the pressure-medium gas can be returned to the hot zone.

The straightening cylinder 8 is formed in a cylindrical shape with a gas-impermeable plate material, and an upper end and a lower end thereof are opened. The upper end of the straightening cylinder 8 is positioned slightly below an inner surface of the upper part of the inner casing 3. In other words, a clearance is formed in the vertical direction between the upper end of the straightening cylinder 8 and the inner casing 3. Through this clearance, the pressure-medium gas present in the hot zone in the inside of the straightening cylinder 8 is guided to either the inner gas flow passage 21 or the outer gas flow passage 20, which are the gas flow passages provided on the outside of the straightening cylinder 8.

The workpiece support table 6 is provided below the straightening cylinder 8. This workpiece support table 6 is formed with a porous plate through which the pressure-medium gas can flow, so that the workpiece support table 6 permeates the pressure-medium gas so as to guide the same from the lower side to the upper side. There is a spacer on the upper side of the workpiece support table 6 as required, and this spacer interposed between the workpiece support table 6 and the workpiece W makes it possible to mount the workpiece W on the workpiece support table 6, while preventing the workpiece W from being brought into direct contact with the upper surface of the workpiece support table 6, in other words, raising the workpiece W.

The straightening cylinder 8 has the gas introduction hole 26. This gas introduction hole 26 is provided at a position further lower than the position of the workpiece support table 6. The gas introduction hole 26 passes through the side wall of the straightening cylinder 8 to communicate the inside and the outside of the same, and allows the pressure-medium gas in the inner gas flow passage 21 to be introduced through the gas introduction hole 26 into the inside of the straightening cylinder 8. The pressure-medium gas introduced through the gas introduction hole 26 into the inside of the straightening cylinder 8 permeates the above-described workpiece support table 6 upward and flows into a space above the workpiece support table 6. The pressure-medium gas then contributes to HIP processing in the hot zone formed above the workpiece support table 6.

This HIP device 1 further includes a cooling unit that cools the inside of the hot zone. This cooling unit includes a first cooling unit and a second cooling unit.

The first cooling unit cools the pressure-medium gas while circulating the same so that the pressure-medium gas forms the first circulating flow 41. In the first circulating flow 41, the circulation is achieved as follows: the pressure-medium gas is brought into contact with the high-pressure container 2 while being guided from below to above along the above-described inner passage 22 formed between the outer casing 4 and the inner casing 3, guided from the upper opening part 15 of the outer casing 4 to the outer passage 12, and further, guided from above to below along the outer passage 12, whereby the pressure-medium gas is cooled; thereafter, the pressure-medium gas thus cooled returns to the inner passage 22 through the lower opening part 16 of the outer casing 4 and the second flow hole 24.

On the other hand, the second cooling unit cools the pressure-medium gas while circulating the same so that the pressure-medium gas forms the second circulating flow 42. In the second circulating flow 42, the circulation is achieved as follows: a part of the pressure-medium gas in the hot zone is guided to the outside of the hot zone, and joins the pressure-medium gas forcibly circulated by the first cooling unit, thereby becoming cooled; then, the part of the pressure-medium gas thus cooled returns to the hot zone.

More specifically, the second cooling unit includes a gas introduction unit 27. The gas introduction unit 27 guides the pressure-medium gas having been cooled in the outside of the outer casing 4 (the part of the pressure-medium gas cooled by the first cooling unit) via an upper part of the hot zone into the inside of the hot zone.

The gas introduction unit 27 includes the plurality of conduits 28 and the forced circulation unit 25. Each conduit 28 extends from a lower part of the hot zone toward an upper part of the hot zone, and is opened in the upper part of the hot zone. The forced circulation unit 25 guides the pressure-medium gas cooled in the outside of the casing along the conduits 28 to the upper part of the hot zone. More specifically, the forced circulation unit 25 is provided in the lower opening part 16 of the outer casing base 14, and circulates the pressure-medium gas by forcibly drawing the pressure-medium gas present below the lower opening part 16 into the hot zone. The forced circulation unit 25 of the present embodiment includes a motor 30 provided on the base 11 of the high-pressure container 2, a shaft part 31 that extends upward from the motor 30 through the lower opening part 16, and a fan 29 mounted at an upper end of the shaft part 31. The fan 29 is housed in a fan housing part 32 formed in the inside of the outer casing base 14. The lower opening part 16 is formed so as to allow the fan housing part 32 and the outer passage 12 to communicate with each other, and allows the shaft part 31 to extend in the vertical direction while passing through the lower opening part 16 in the vertical direction. The fan 29, rotating around the shaft part 31, forcibly generates flows directed from below to above in the pressure-medium gas.

More specifically, in the forced circulation unit 25, the motor 30 drives and rotates the fan 29 provided at an end of the shaft part 31, which forcibly causes the pressure-medium gas stored below the outer casing base 14 to flow through the lower opening part 16 into the fan housing part 32. The pressure-medium gas thus flowing into the fan housing part 32 is sent through each conduit 28 to the upper part of the hot zone, and flows into the hot zone via the upper part of the same, thereby cooling the inside of the hot zone. The forced circulation unit 25 is not limited to a unit including a fan, and may be, for example, a unit including a pump or the like.

Each conduit 28 is intended to send the pressure-medium gas having flown into the fan housing part 32 toward the upper part of the hot zone, and is formed with a pipe-like member having a hollow inside so as to guide the foregoing pressure-medium gas in such a manner that the pressure-medium gas should not leak and should not meet the pressure-medium gas in the hot zone. Each conduit 28 has a lower end that is opened in the fan housing part 32, so as to take the pressure-medium gas in the fan housing part 32 into the conduit 28 through this lower end. On the other hand, an internal base wall 50 is interposed between the straightening cylinder 8 and the outer casing base 14. Each conduit 28 extends in the vertical direction from the fan housing part 32 positioned below the hot zone along an outer circumference surface of the internal base wall 50 and the outer circumference surface of the straightening cylinder 8, and an upper end of the conduit 28 reaches the upper part of the hot zone.

More specifically, each conduit 28 extends upward from the lower end thereof that is opened at the upper end of the fan housing part 32, bends outward in the radial direction in the inside of the internal base wall 50, then, bends upward again when the same reaches the outer circumference surface of the internal base wall 50, and linearly extends upward along the outer circumference surface of the straightening cylinder 8 up to the upper part of the hot zone. The upper end of the conduit 28 is opened toward the upper part of the hot zone.

In other words, the upper end of the conduit 28 is bent from the outer side in the radial direction to the inner side in the radial direction so as to be directed toward the upper end of the hot zone. The conduit 28 has an end formed in a tapered shape like a nozzle. If the end of the conduit 28 is thus formed in a nozzle shape directed to the inner side in the radial direction, the pressure-medium gas jetted from this end of the conduit 28, and the pressure-medium gas having moved upward through the hot zone, are brought into counterflow contact, thereby becoming mixed with each other. Therefore, this makes it possible to surely mix pressure-medium gases having so large a temperature difference that they are hard to be mixed with each other (more specifically, the pressure-medium gas jetted from the end of the conduits 28, and the pressure-medium gas having moved upward in the hot zone).

In the present embodiment, the conduits 28 are arranged at two positions that are symmetric with respect to the center of the straightening cylinder 8 (positions at an angle of 180° around the center). The number of the conduits 28, however, may be one, or alternatively, three or more. Further, in the case where a plurality of conduits 28 are provided, these conduits 28 are not necessarily arranged at uniform distances in the circumferential direction.

This HIP device 1 further includes a second valve means 33 that has a function as a throttle. The second valve means 33 is provided in a middle part of the above-described second flow hole 24, and reduces the flow rate of the pressure-medium gas flowing through the second flow hole 24, thereby making it possible to adjust the ratio of the flow rate of the pressure-medium gas flowing through the above-described conduits 28 and the flow rate of the pressure-medium gas fed back to the inner passage 22. Such opening/closing of the second flow hole 24 by the second valve means 33 makes it possible to adjust the ratio of the flow rate of the pressure-medium gas flowing from the fan housing part 32 into the inner passage 22 and the flow rate of the pressure-medium gas flowing into the hot zone, and further, makes it possible to arbitrarily change the ratio (flow rate ratio) of the flow rate of the pressure-medium gas forming the first circulating flow 41 and the flow rate of the pressure-medium gas forming the second circulating flow 42, thereby making it possible to more precisely control the cooling speed of the HIP device 1.

Though the pressure-medium gas forming the first circulating flow 41 is cooled as described above, it cannot be considered that sufficient cooling is achieved, when heat-resisting properties of electrical components are taken into consideration, such as driving mechanisms for the fan 29, the motor 30, and the second valve means 33 that compose the forced circulation unit 25 provided in the lower part of the high-pressure container 2, and the electric heater and the thermocouple for measuring temperature that compose the heating unit 7.

To cope with this, the HIP device 1 illustrated in FIG. 1 further includes a cooling promotion unit 37. The cooling promotion unit 37 causes the pressure-medium gas cooled in the outside of the outer casing 4 (outer passage 12) to exchange heat with the base 11, thereby further cooling the pressure-medium gas that has been cooled by the first cooling means, and feeds the pressure-medium gas thus cooled to the gas storage unit 35 above the base 11.

As illustrated in FIG. 1, the gas storage unit 35 is a space formed between the base 11 and the casing base 14 described above, in which the pressure-medium gas to be introduced to the gas introduction unit 27 can be stored. The gas storage unit 35 is positioned below the fan housing part 32 in the inside of the casing base 14. The gas storage unit 35 is separated by a partition wall 48 from the space outside the outer casing 4, that is, the outer passage 12.

The cooling promotion unit 37 causes the pressure-medium gas that has been cooled outside the outer casing 4 to exchange heat with the base 11, thereby cooling the pressure-medium gas, and thereafter sends the pressure-medium gas to the gas storage unit 35. More specifically, the cooling promotion unit 37 of the First Embodiment includes a gas cooling flow passage 36 formed in the inside of the base 11, and the gas cooling flow passage 36 guides the pressure-medium gas so that pressure-medium gas cooled outside the outer casing 4 should circulates through the base 11.

Next, the gas storage unit 35, and the gas cooling flow passage 36, which composes the cooling promotion unit 37, are described in detail.

The gas storage unit 35 is formed below the lower surface of the casing base 14, and is opened downward. The inside of the gas storage unit 35 is hollow, and the pressure-medium gas is stored in the hollow. The fan housing part 32 is positioned above the gas storage unit 35, and the gas storage unit 35 and the fan housing part 32 are caused to communicate with each other by the above-described lower opening part 16. Further, the gas storage unit 35 houses equipment weak to high temperature such as the motor 30 and the second valve means 33, which compose the forced circulation unit 25 weak to high temperature.

The gas storage unit 35 is separated from the outer passage 12, as described above. More specifically, the HIP device 1 includes a partition wall 47. The partition wall 47 is interposed between the lower end of the casing base 14 and the upper surface of the base 11, thereby separating the gas storage unit 35 and the outer passage 12 from each other. Between the lower surface of the partition wall 47 and the upper surface of the base 11, a heat-insulation layer lower seal 43 is interposed, which prevents the pressure-medium gas from entering the gas storage unit 35 from the outer passage 12. With the heat-insulation layer lower seal 43 and the partition wall 47, the gas storage unit 35 is separated in an airtight state from the outside of the outer casing 4 (the outer passage 12).

The gas cooling flow passage 36 is a flow passage through which the pressure-medium gas cooled outside the outer casing 4 flows, and is formed in the inside of the base 11 so as to allows the pressure-medium gas to circulate through the inside of the base 11 and exchange heat with the base 11. The base 11 hardly receives heat flux from the hot zone during the heating step or the processing step in the HIP processing, and is cooled to a low temperature close to room temperature in many cases. Therefore, even the pressure-medium gas that has flown through the outer passage 12 thereby being cooled once can be further cooled to a lower temperature by heat exchange with the base 11. The gas cooling flow passage 36, therefore, is formed so as to cause the pressure-medium gas that has been cooled by flowing through the outer passage 12 to exchange heat with the base 11, thereby cooling the same to a further lower temperature, and send the pressure-medium gas thus further cooled to the gas storage unit 35.

More specifically, a gas inlet port 44 for intake of the pressure-medium gas is formed in a portion of the upper surface of the base 11, where the lowest portion of the outer passage 12 is positioned, and on the other hand, a gas outlet port 45 for supplying the pressure-medium gas thus taken in through the gas inlet port 44 into the gas storage unit 35 is formed in a portion of the upper surface of the base 11 facing the above-described gas storage unit 35. The gas cooling flow passage 36 connects the gas inlet port 44 and the gas outlet port 45. The gas cooling flow passage 36 passes through the inside of the base 11 while avoiding the partition wall 48, and circulates through the inside of the base 11 so as to make large meandering in the base 11. This circulation makes it possible to ensure a sufficient area for heat exchange between the base 11 in a low-temperature state and the pressure-medium gas.

The HIP device 1 according to the present embodiment further includes a base cooling unit 38. The base cooling unit 38 is provided in the base 11, and cools the base 11 itself so that the amount of heat exchanged between the gas cooling flow passage 36 of the above-described cooling promotion unit 37 and the pressure-medium gas can be increased further. The base cooling unit 38 is composed of a flow passage that passes through the inside of the base 11, and a cooling medium such as cool water, alternatives for chlorofluorocarbon, etc., cooled by a chiller or the like, can flow through this flow passage. The base cooling unit 38 causes the temperature of the base 11 to fall further, thereby making it possible to allow the base 11 cool the pressure-medium gas passing through the gas cooling flow passage 36 to a further lower temperature, and to allow the base 11 to stably exhibit a high cooling ability with respect to the pressure-medium gas. Such a base cooling unit 38 is preferable since the same makes it possible to quickly radiate heat of the base 11 particularly in a quick cooling process.

A method for cooling the hot zone by using the HIP device 1 of the First Embodiment described above, that is, a cooling method by the HIP device 1, is described below.

Isotropic-pressure processing is performed with respect to a workpiece W by the HIP device 1 having the above-described configuration, and next, a quick cooling step is performed for cooling the workpiece W in a short time. The quick cooling step is performed by moving the plug member 18 upward in a state in which the heating by the heating unit 7 is stopped, and rotating the fan 29 of the forced circulation unit 25.

Here, when the flow rate of the pressure-medium gas is adjusted by the above-described second valve means 33, this makes it possible to adjust the flow rate ratio between the flow rate of the pressure-medium gas fed back via the second flow hole 24 and the inner passage 22 to the outer passage 12 and the flow rate of the pressure-medium gas guided through the conduits 28 to the hot zone, which as a result makes it possible to control the temperature of the pressure-medium gas after the joining of the low-temperature pressure-medium gas, which forms the first circulating flow 41 in the outer passage 12, and the high-temperature pressure-medium gas, which forms the second circulating flow 42.

The pressure-medium gas, guided to the outer passage 12 after joining in this way, exchanges heat with the container wall of the high-pressure container 2 while falling along the inner circumference surface of the high-pressure container 2, thereby becoming cooled. At the beginning of the cooling of the pressure-medium gas, the container wall of the high-pressure container 2 has a temperature sufficiently lower than the temperature of the pressure-medium gas, and hence, to increase the flow rate of the pressure-medium gas flowing through outer passage 12 as much as possible is advantageous for performing the cooling effectively.

When the cooling process progresses and the temperature of the container wall of the high-pressure container 2 rises, the temperature of the pressure-medium gas does not fall much, in spite of heat exchange between the pressure-medium gas and the inner circumference surface of the high-pressure container 2. For example, at the beginning of the cooling, the temperature of the pressure-medium gas, when cooled in the outer passage 12, falls to a level such as several tens of degrees Celsius. As the cooling progresses, however, even though the pressure-medium gas is cooled in the outer passage 12, the temperature is maintained close to 200° C. If such a high-temperature pressure-medium gas having a temperature close to 200° C. flows, in the same state, into the gas storage unit 35 provided in the lower part of the high-pressure container 2, there is a higher possibility that the high-temperature pressure-medium gas would be brought into contact with and burnout electrical components such as the driving mechanisms for the fan 29, the motor 30, and the second valve means 33 composing the forced circulation unit 25, or contact points of the electric heater and the thermocouple for measuring temperature, which compose the heating unit 7, etc.

In the HIP device 1 of the First Embodiment, however, the pressure-medium gas, becoming cooled while falling through the outer passage 12, passes through the gas cooling flow passage 36, whereby the cooling of the pressure-medium gas is further promoted. As the gas cooling flow passage 36 is formed so as to circulate through the inside of the base 11, heat exchange between the pressure-medium gas having flown through the outer passage 12 thereby being cooled and the base 11 is made possible, which makes it possible to cool the pressure-medium gas to a further lower temperature. Then, the pressure-medium gas thus cooled to a further lower temperature in the gas cooling flow passage 36 is sent to the gas storage unit 35.

In the gas storage unit 35, there are provided the driving mechanisms for the fan 29, the motor 30, and the second valve means 33 of the forced circulation unit 25, which are electric equipment weak to high temperature, or contact points of the electric heater, thermocouple for measuring temperature and the like used in the heating unit 7. As the pressure-medium gas cooled to a further lower temperature by the above-described gas cooling flow passage 36 is stored in this gas storage unit 35, however, burnout of the electrical component can be prevented. Therefore, the inside of the processing chamber (hot zone) can be cooled efficiently in a short time after HIP processing, without burnout of electrical components provided in the lower part of the high-pressure container 2. Besides, in a quick cooling step as well, the inside of the hot zone can be kept surely at a temperature at or lower than the heat resistance limit.

Next, the Second Embodiment of the present invention is described.

Figure 2:
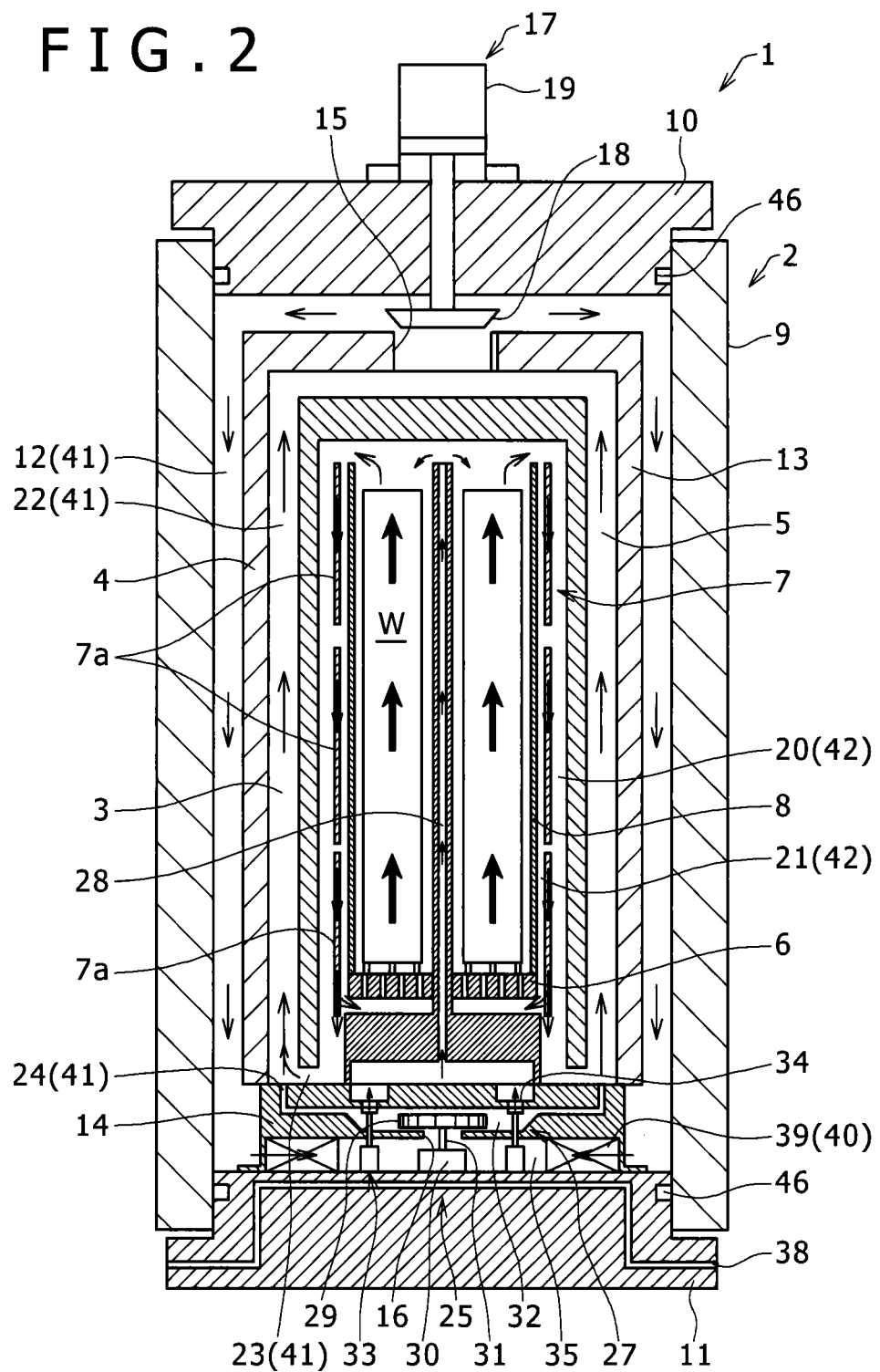
FIG. 2 is a sectional front view of a HIP device according to a Second Embodiment.

FIG. 2 illustrates a HIP device 1 according to the Second Embodiment. The HIP device 1 includes a cooling promotion unit as is the case with the HIP device 1 according to the First Embodiment described above, but this cooling promotion unit includes a heat exchanger 39 in place of the gas cooling flow passage 36. The heat exchanger 39 causes the pressure-medium gas cooled outside the casing on the primary side thereof and the base 11 on the secondary side to exchange heat.

In the HIP device 1 according to the Second Embodiment, a partition wall 47 like that in the First Embodiment is not provided between the outer casing base 14 and the base 11, the pressure-medium gas is permitted to freely move between the inside and the outside of the outer casing 4 through the space between the outer casing base 14 and the base 11. In the space between the outer casing base 14 and the base 11, which is a passage that allows the pressure-medium gas to move therethrough, the heat exchanger 39 is provided.

The heat exchanger 39 has a structure that allows the pressure-medium gas to freely pass therethrough, and that causes heat exchange between the pressure-medium gas that forms the first circulating flow 41 falling along the inner circumference surface of the container wall of the high-pressure container 2 and the base 11, thereby cooling the pressure-medium gas, and guides the pressure-medium gas thus cooled to the gas storage unit 35. As the structure of the heat exchanger 39, the following structure is preferably used: a multilayer structure that includes fins and the like provided on the upper surface of the base 11 in order to make it possible to expand an area for heat exchange between the pressure-medium gas and the base 11; or a porous structure that includes porous fins and the like for expansion of a flow passage area.

Further, above the heat exchanger 39, a heat insulation member is preferably provided that prevents heat of the outer casing base 14 from being transmitted via the heat exchanger 39 to the base 11. Such a heat insulation member makes it possible to suppress temperature rise of the base 11 due to heat of the outer casing base 14 so as to effectively cool the pressure-medium gas.

In the HIP device 1 illustrated in FIG. 2, conduits 28 similar to those illustrated in FIG. 1 are provided at the center of the hot zone. The conduits 28, however, may be provided on an outer circumference side of the hot zone, as is the case with the configuration illustrated in FIG. 1.

The HIP device 1 according to the Second Embodiment described above makes it possible to further cool the pressure-medium gas of the first circulating flow after heat exchange with the inner circumference surface of the container wall of the container main body 9. Further, in the Second Embodiment, unlike the First Embodiment, there is no need to form the gas cooling flow passage 36 for flowing the pressure-medium gas through the inside of the base 11, which makes it possible to maintain the function of the base 11 as a pressure-resistant member for resisting to high pressure in the inside of the high-pressure container 2 in a better state, thereby elongating the service life of the base 11.

In other words, the heat exchanger 39, which composes the cooling promotion unit in the HIP device 1 according to the Second Embodiment, is another member than the base 11 functioning as a pressure-resistant member. Therefore, the heat exchanger 39 can be made of copper or aluminum suitable for heat exchange, and can have a multilayer structure, a porous structure, a fin structure, or the like. With this configuration, the heat exchanger 39 is allowed to have a high cooling promotion function.

The present invention is not limited to the embodiments described above, but the shape, the structure, and the material of each member, and the combination of the same can be changed appropriately within such a range that the nature of the invention should not be changed. In particular, in the embodiments disclosed herein, regarding matters that are not clearly disclosed, for example, driving conditions, operation conditions, various types of parameters, sizes, weights, and volumes of constituent members, values are used that are not out of ranges that persons skilled in the art ordinary use and that can be easily thought of by any normal persons skilled in the art.

As described above, according to the present invention, a hot isostatic pressing device is provided that can efficiently cool a hot zone in a processing chamber including a lower part of a high-pressure container, after HIP processing. The hot isostatic pressing device includes the following: a gas-impermeable casing that has gas impermeability and is arranged so as to surround a workpiece; a heating unit that is provided inside the casing so as to form a hot zone around the workpiece, thereby making it possible to perform hot isostatic pressing processing to the workpiece by using a pressure-medium gas in the hot zone; a high-pressure container that surrounds a space where the heating unit and the casing are housed and that includes a base that closes the space from below; and a cooling unit that cools the hot zone by guiding, into the hot zone, the pressure-medium gas having been cooled while flowing from above to below outside the casing. The cooling unit includes the following: a gas introduction unit that guides the pressure-medium gas cooled outside the casing, from a lower part of the high-pressure container to an upper part of the hot zone into the hot zone, in such a manner that the pressure-medium gas should meet the pressure-medium gas inside the hot zone; and a cooling promotion unit that cools the pressure-medium gas having been cooled outside the casing by allowing the pressure-medium gas to exchange heat with the base.

With this HIP device, which promotes the cooling the pressure-medium gas by using the base that composes the high-pressure container, it is possible to efficiently cool the inside of a processing chamber (hot zone) after HIP processing without burnout of electrical components provided in the lower part of the high-pressure container.

Preferably, the casing includes a casing body having a lower-side opening, and a casing base that closes the lower-side opening of the casing body; a gas storage unit that stores the pressure-medium gas to be introduced to the gas introduction unit is provided between the base and the casing base, in a state of being separated from the space outside the casing; and the cooling promotion unit sends the pressure-medium gas having exchanged heat with the base to the gas storage unit.

Preferably, the cooling promotion unit includes, for example, a gas cooling flow passage that is formed inside the base and guides the pressure-medium gas having cooled outside the casing so that the pressure-medium gas circulates through the inside of the base. This gas cooling flow passage makes it possible to cause the base and the pressure-medium gas to exchange heat, without using special members.

Alternatively, the cooling promotion unit may include a heat exchanger that causes heat exchange between the pressure-medium gas having been cooled outside the casing and the base.

The HIP device according to the present invention preferably further includes a base cooling unit that forcibly cools the base by flowing another refrigerant than the pressure-medium gas through the base.

The invention claimed is:
1. A hot isostatic pressing device comprising:
a gas-impermeable casing that is arranged so as to surround a workpiece;
a heating unit that is provided inside the casing so as to form a hot zone around the workpiece, thereby making it possible to perform hot isostatic pressing processing to the workpiece by using a pressure-medium gas in the hot zone;
a high-pressure container that surrounds a space where the heating unit and the casing are housed and that includes a base that closes the space from below; and
a cooling unit that cools the hot zone by guiding, into the hot zone, the pressure-medium gas having been cooled while flowing from above to below outside the casing, wherein the cooling unit comprises:

a gas introduction unit that guides the pressure-medium gas cooled outside the casing, from a lower part of the high-pressure container to an upper part of the hot zone into the hot zone, in such a manner that the pressure-medium gas should not meet the pressure-medium gas inside the hot zone; and a cooling promotion unit that cools the pressure-medium gas having been cooled outside the casing by allowing the pressure-medium gas to exchange heat with the base.

2. The hot isostatic pressing device according to claim 1, wherein the casing includes a casing body having a lower-side opening, and a casing base that closes the lower-side opening of the casing body, a gas storage unit that stores the pressure-medium gas to be introduced to the gas introduction unit is provided between the base and the casing base, in a state of being separated from the space outside the casing, and the cooling promotion unit sends the pressure-medium gas having exchanged heat with the base to the gas storage unit.

3. The hot isostatic pressing device according to claim 1, wherein the cooling promotion unit includes a gas cooling flow passage that is formed inside the base and guides the pressure-medium gas having cooled outside the casing so that the pressure-medium gas circulates through the inside of the base.

4. The hot isostatic pressing device according to claim 1, wherein the cooling promotion unit includes a heat exchanger that causes heat exchange between the pressure-medium gas having been cooled outside the casing and the base.

5. The hot isostatic pressing device according to claim 1, further comprising:

a base cooling unit that forcibly cools the base by flowing another refrigerant than the pressure-medium gas through the base.

6. The hot isostatic pressing device according to claim 1, wherein a lower part of the high pressure container contains at least one electrical component selected from the group consisting of a fan, motor, valve, actuator, contact points and thermocouple.

* * * * *